United States Patent [19]

Blank et al.

[11] 4,139,905
[45] Feb. 13, 1979

[54] MAGNETIC DEVICES UTILIZING GARNET EPITAXIAL MATERIALS

[75] Inventors: Stuart L. Blank, Madison; Roy C. LeCraw, Summit; Raymond Wolfe, New Providence, all of N.J.

[73] Assignee: Bell Telephone Laboratories, Incorporated, Murray Hill, N.J.

[21] Appl. No.: 695,779

[22] Filed: Jun. 14, 1976

[51] Int. Cl.² .................. G11C 11/14; G11B 5/00
[52] U.S. Cl. .................... 365/33; 156/605; 156/606; 252/62.57; 252/62.59; 252/62.53; 428/539; 428/900
[58] Field of Search ............ 427/128, 129, 130, 131, 427/132; 428/900, 538, 539; 156/605, 606; 360/131, 138, 135, 136; 340/174 TF, 174 SR, 174 M; 252/62.57, 62.63, 62.59; 365/33

[56] References Cited
U.S. PATENT DOCUMENTS 3,995,093  11/1976  Heinz .......................... 428/900
4,002,803  1/1977  Blank .......................... 428/900

Primary Examiner—Stanley S. Silverman
Attorney, Agent, or Firm—Peter V. D. Wilde

[57] ABSTRACT

Members of a class of garnet compositions of particular crystallographic orientation are usefully incorporated in magnetic memory devices which depend for their operation on the positioning of single wall domains ("bubbles"). Such compositions, ordinarily in the form of a supported layer defining a (110) orientation, manifest high limiting bubble velocity, thereby making possible high record and retrieval rates. Compositions invariably contain some lanthanum in the dodecahedral site. Increased limiting velocity is attributed to in-plane anisotropy, in turn, dependent upon partial lanthanum occupation. Depending upon composition, required unique easy direction out of the plane may be as-grown, stress induced, or a combination. Appropriate garnet substrates of required lattice parameters are described.

15 Claims, 2 Drawing Figures

MAGNETIC DEVICES UTILIZING GARNET EPITAXIAL MATERIALS

BACKGROUND OF THE INVENTION

1. Field of the Invention

The invention is concerned with magnetic domain devices such as "bubble" devices. In particular, the invention is concerned with devices which include a supported layer of magnetic garnet material, generally, but not necessarily, on a non-magnetic garnet substrate. Such devices depend for their operation on nucleation and/or propagation of small enclosed magnetic domains of polarization opposite to that of the immediately surrounding material in the supported layer. Functions which may be performed include switching, memory, logic, etc.

2. Description of the Prior Art

Relevant art concerns a class of memory or switching elements known as "bubble" devices. The term "bubble" is descriptive of the generally cylindrical form taken by the single wall domains, presence or absence of which constitutes the memory bits essential to operation. Such single wall domains, which may assume a variety of configurations, represent localized regions of one magnetic polarization within a surround of opposite polarization. Polarization, in either case, is largely orthogonal to a major surface of the device so that domains may be described as emergent—that is, with polarization "emerging" from a major plane. There is a vast body of literature on devices of this category. See, for example, Vol. MAG-5, *IEEE Transactions on Magnetics* page 544 (1969) and *Scientific American,* June (1971) p. 78–90.

Material requirements imposed on magnetic compositions have, in many respects, been more stringent than those imposed by other devices. For example, contemplation of domain or bit size of the order of a micrometer or less has carried with it the attendant requirement that material imperfections affecting nucleation or propagation be of a smaller size scale. Requirements on uniformity, both physical and compositional, have been legend, and solutions to these many problems have been impressive. Technology has resulted in development: of supposedly cubic garnets evidencing controllable and pronounced, unique easy directions of magnetization; of procedures for growing epitaxial layers of perhaps the highest physical and compositional uniformity yet seen under growth conditions considered a marked departure from all prior techniques; and of ancillary advances, e.g., concerned with fine scale access circuitry, lithographic techniques, etc. The program has already had and will continue to have widespread implications in a variety of arts.

It has been recognized for some time that a major material problem involves the precise manner in which the emergent domain is produced. Since garnet materials have been the leading contenders for bubble devices for some time, concern over emergence has generally been in terms of such materials. Two major approaches have been followed: the first, "growth induced anisotropy" relies on mixed population in a given crystallographic site, usually the dodecahedral site. Such mixed population of appropriate ions results in some form of local strain or preferential ordering attendant upon growth. Growth-induced unique easy direction is maintained at all but extremely high temperature (temperatures not ordinarily contemplated during use). Magnetic properties in growth-induced materials may, in selected compositions, be substantially temperature independent or may vary so as to match bubble properties to temperature in a desired manner. Characteristically, such compositions include praseodymium, neodymium, samarium, europium or terbium together with a different rare earth (or yttrium) ion. Growth induced materials are eminently useful for many device designs.

A second approach makes use of massive strain ordinarily induced by a disparity between crystallographic lattice dimensions of supported layer and substrate. For example, supported epitaxial materials evidencing a negative value of magnetostriction, when supported on a substrate material of larger lattice dimension, show the emergent domain behavior.

Regardless of the mechanism/s responsible for the necessarily unique easy direction of magnetization, a characteristic of device concern is permitted speed of record and access. This parameter is ultimately dependent on the rate with which the bubble may be moved from any given position to an adjacent position. It, therefore, depends on such considerations as device design, traversal distance, and characteristics of auxiliary equipment, such as drive frequency.

Materials within which bubbles are nucleated and/or propagated are characterized by an inherent speed factor: mobility. This factor, when multiplied by the field in the material resulting from the applied drive field, results in a "velocity" term. In many of the materials used in the earlier stages of bubble devices, record and access time were limited by mobility. So, for example, materials containing substantial amounts of terbium in the dodecahedral site were typically characterized by mobility values of about 100 cm/sec/Oersted. Applied drive fields, conveniently at a level of perhaps 5 Oersteds, in consequence, resulted in velocities of about 500 cm/sec. As materials with higher mobility were designed, it was found that real rates of record or access were limited by another consideration. So, samarium-containing materials, characterized by mobilities as high as 1300 cm/sec/Oersted, while yielding velocities as high as 3000 cm/sec with relatively low drive fields, resulted in a loss of information as drive field was increased. Velocity limits generally did not exceed 1 megahertz operation. This is the frequency of field reversal and, therefore, the cycle time for movement of any given bubble to an adjacent position. For structures with position spacings of approximately 28 $\mu$m, this is equivalent to a velocity of 2800 cm/sec. Attempts to exceed such limiting velocities were found to result in loss of information. While the responsible mechanism has not been irrefutably established, it appears to involve a change in domain wall configuration, probably from a simple Bloch wall to a wall with a number of Bloch-to-Néel transitions. This characteristic, sometimes referred to as "dynamic conversion", results in bubbles which are "erratic" in that they do not follow the drive field in the predictable fashion of bubbles moving at lower velocities.

A recent approach to attainment of higher limiting velocity involves use of high g factor materials. See 26 App. Phys. Lett. 402, 722 (1975). Such compositions are characterized by partial dodecahedral site occupancy by europium and by low magnetic moment contribution by iron sub-lattices. High g factor is due to the two factors: (1) near magnetic balance between the anti-ferromagnetically coupled sub-lattices and (2) a sufficient europium content to result in a significant magnetic moment ($4\pi M$). While use of supported layers of such materials does result in the best limiting velocity values (commensurate with other device properties) attained at least in as-grown unique easy direction materials, the nature of the temperature dependence of magnetization results in departure from usual biasing magnet structures for device designs making full utilization of the material properties. This need has, in turn, been met to a large extent by a particular class of magnet materials.

It has been recognized for some time that a possible improvement in limiting velocity may result from an anisotropy in addition to that necessary for supporting bubbles. This anisotropy, lying in the plane of the supported layer, whether stress or growth induced, is expected to result in improvement in this most significant parameter. This premise has early origins. See B7 Phys. Rev. 391 (1973).

Despite the acknowledged desirability of this approach, a successful application of the principle to garnet layers—normally isotropic in-plane—has not been realized. It is recognized that other desired device characteristics, primarily desired orthogonality of unique easy direction out of plane, dictates use of a layer substantially defining a (110) plane. Other constraints, some practical, e.g., the general requirement of a substantially perfect single crystal layer, must also be considered.

SUMMARY OF THE INVENTION

Accomplishment of the desired in-plane anisotropy to result in increased limiting velocity in devices dependent upon nucleation and propagation of domain walls is realized by specified lanthanum-containing supported garnet films. Partial lanthanum occupation of the dodecahedral site may be supplemented by other 4f rare earths to result in the desired unique easy direction being growth induced or, alternately, such easy direction may be stress induced. Devices in which bubble integrity results from a combination of both influences are contemplated. In contrast to the high g factor materials increased value of limiting velocity is not dependent upon a balance or near balance of antiferromagnetically coupled iron ions. Accordingly, $4\pi M_s$ values may be tailored as desired. Since this is a major factor affecting bubble size, this parameter may be tailored essentially independently of velocity. In contrast to the high g factor materials which are necessarily characterized by small $4\pi M_s$ values, compositions of the invention may be designed to support bubbles of micrometer and submicrometer dimensions.

Compositions of the invention invariably contain lanthanum. This is true whether bubble integrity is due to as grown or stress induced unique easy direction. Based on the prototypical garnet composition expressed in atom units, $I_3II_5O_{12}$ (I = dodecahedral site ions, II = tetrahedral and octahedral ions, and O = oxygen), the minimum lanthanum content is 0.1 atom. Other dodecahedral site occupancy may be by other rare earths, e.g., including europium and/or samarium in combination with another ion, to result in growth induced easy direction as well as others to satisfy other needs, for example, valence balancing or other device parameters. Following conventional practice, tetrahedral and/or octahedral site occupancy may include a variety of ions, for example, to tailor magnetic moment to desired value, to alter temperature dependence, for example of magnetization, to alter lattice parameters, etc. As in garnet compositions finding prevalent use in bubble devices, a major contribution to magnetization results from imbalance to antiferromagnetically coupled iron ions in the tetrahedral and octahedral sites.

It has been indicated that the invention is properly characterized as the satisfaction of conditions required to realize a suitable [110] supported garnet layer. A first requirement common with other such layers is suitable match in crystal lattice parameters to permit perfect or near perfect epitaxial growth. Maximum mismatch in lattice parameter is up to approximately ±0.06 Angstrom unit out of 12 Angstrom units (this value is equivalent to approximately ±0.5 percent). Depending upon the particular supported garnet composition, a variety of garnet substrate compositions may be utilized. In a specific embodiment, mismatch within the limits ±0.02 Angstrom unit is accomplished by use of a substrate of $Nd_3Ga_5O_{12}$ oriented to [110] ±5 degrees. For this specific embodiment unique easy direction is largely growth induced. Consistent with prior experience by workers in this art, a preference exists for growth induced easy direction. A preferred embodiment is defined as encompassing those devices in which such easy direction is predominant as growth induced.

DETAILED DESCRIPTION

1. The Figures

Figure 1:
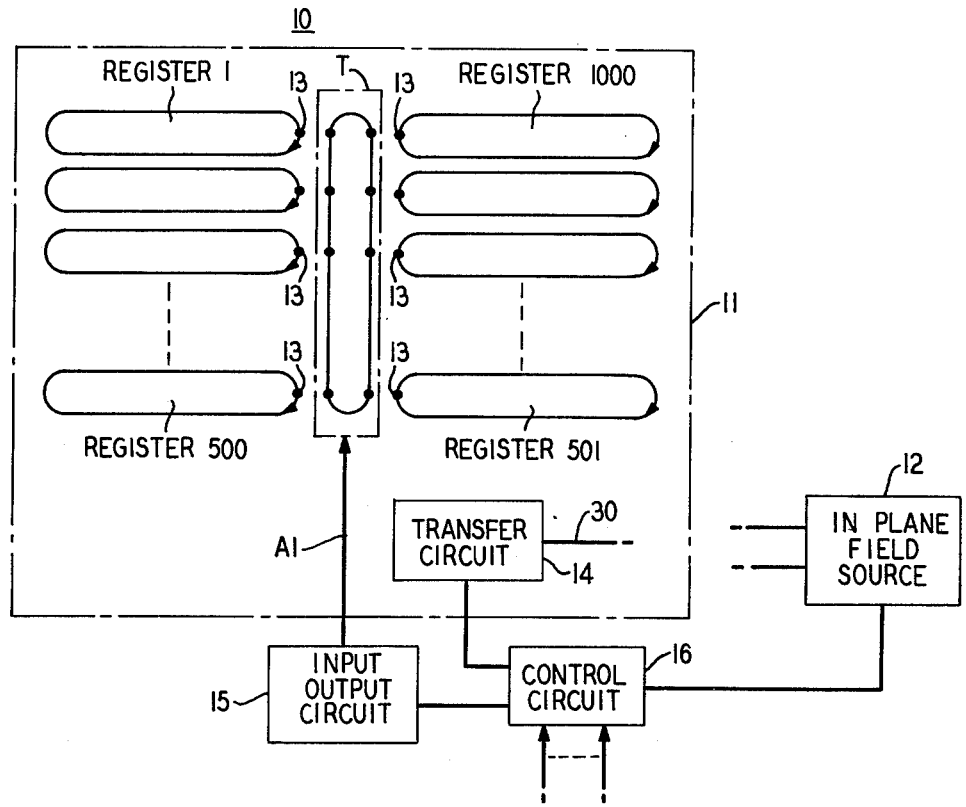
FIG. 1 is a schematic diagram of a recirculating memory in accordance with the invention.
Figure 2:
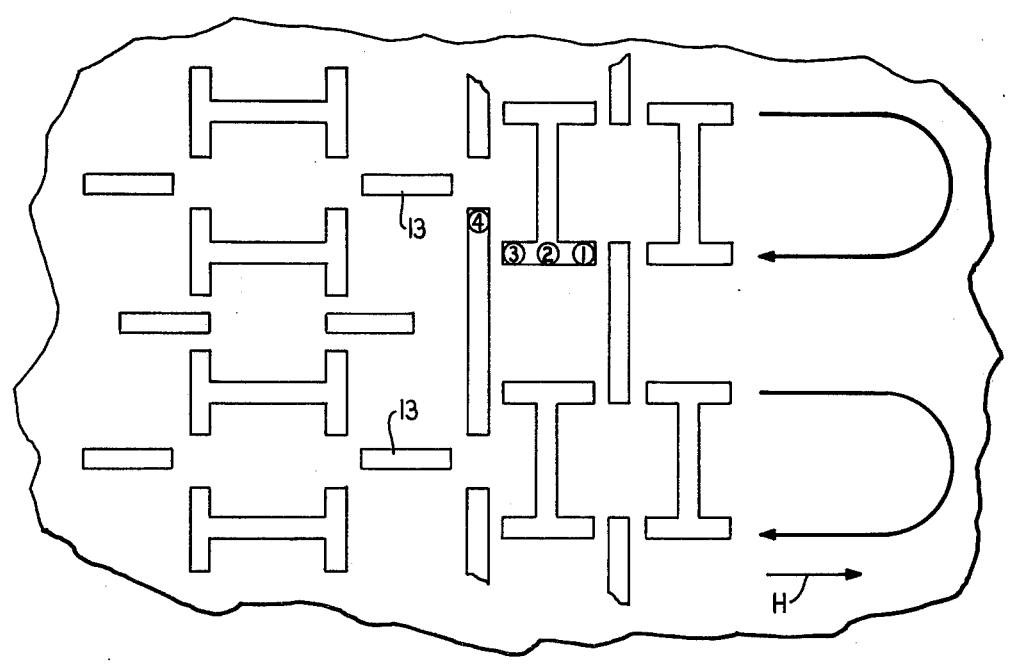
FIG. 2 is a detailed magnetic overlay and wiring configuration for portions of the memory of FIG. 1 showing domain locations during operation.

The device of FIGS. 1 and 2 is illustrative of the class of "bubble" devices described in *IEEE Transactions on Magnetics*, Vol. MAG-5, No. 3, September 1969, pp. 544–553, in which switching, memory and logic functions depend upon the nucleation and propagation of enclosed, generally cylindrically shaped, magnetic domains having a polarization opposite to that of the immediately surrounding area. Interest in such devices centers, in large part, on the very high packing density so afforded, and it is expected that commercial devices with from $10^5$ to $10^7$ bit positions per square inch will be commercially available. The device of FIGS. 1 and 2 represents a somewhat advanced stage of development of the bubble devices and includes some details which have been utilized in recently operated devices.

FIG. 1 shows an arrangement 10 including a layer 11 of material in which single wall domains can be moved. The movement of domains, in accordance with this invention, is dictated by patterns of magnetically soft overlay material in response to reorienting in-plane fields. For purposes of description, the overlays are bar and T-shaped segments and the reorienting in-plane field rotates clockwise in the plane of sheet 11 as viewed in FIGS. 1 and 2. The reorienting field source is represented by a block 12 in FIG. 1 and may comprise mutually orthogonal coil pairs (not shown) driven in quadrature, as is well understood. The overlay configuration is not shown in detail in FIG. 1. Rather, only closed "information" loops are shown in order to permit a simplified explanation of the basic organization in accordance with this invention unencumbered by the details of the implementation hereinafter.

The figure shows a number of horizontal closed loops separated into right and left banks by a vertical closed loop as viewed. It is helpful to visualize information, i.e., domain patterns, circulating clockwise in each loop as an in-plane field rotates clockwise.

The movement of domain patterns simultaneously in all the registers represented by loops in FIG. 1 is synchronized by the in-plane field. To be specific, attention is directed to a location identified by the numeral 13 for each register in FIG. 1. Each rotation of the in-plane field advances a next consecutive bit (presence or absence of a domain) to that location in each register. Also, the movement of bits in the vertical channel is synchronized with this movement.

In normal operation, the horizontal channels are occupied by domain patterns and the vertical channel is unoccupied. A binary word comprises a domain pattern which occupies simultaneously all the positions 13 in one or both banks, depending on the specific organization, at a given instance. It may be appreciated that a binary word so represented is fortunately situated for transfer into the vertical loop.

Transfer of a domain pattern to the vertical loop, of course, is precisely the function carried out initially for either a read or write operation. The fact that information is always moving in a synchronized fashion permits parallel transfer of a selected word to the vertical channel by the simple expedient of tracking the number of rotations of the in-plane field and accomplishing parallel transfer of the selected word during the proper rotation.

The locus of the transfer function is indicated in FIG. 1 by the broken loop T encompassing the vertical channel. The operation results in the transfer of a domain pattern from (one or) both banks of registers into the vertical channel. A specific example of an information transfer of a one thousand bit word necessitates transfer from both banks. Transfer is under the control of a transfer circuit represented by block 14 in FIG. 1. The transfer circuit may be taken to include a shift register tracking circuit for controlling the transfer of a selected word from memory. The shift register, of course, may be defined in material 11.

Once transferred, information moves in the vertical channel to a read-write position represented by vertical arrow A1 connected to a read-write circuit represented by block 15 in FIG. 1. This movement occurs in response to consecutive rotations of the in-plane field synchronously with the clockwise movement of information in the parallel channels. A read or write operation is responsive to signals under the control of control circuit 16 of FIG. 1 and is discussed in some detail below.

The termination of either a write or a read operation similarly terminates in the transfer of a pattern of domains to the horizontal channel. Either operation necessitates the recirculation of information in the vertical loop to positions (13) where a transfer operation moves the pattern from the vertical channel back into appropriate horizontal channels as described above. Once again, the information movement is always synchronized by the rotating field so that when transfer is carried out appropriate vacancies are available in the horizontal channels at positions 13 of FIG. 1 to accept information. For simplicity, the movement of only a single domain, representing a binary one, from a horizontal channel into the vertical is illustrated. The operation for all the channels is the same as is the movement of the absence of a domain representing a binary zero. FIG. 2 shows a portion of an overlay pattern defining a representative horizontal channel in which a domain is moved. In particular, the location 13 at which domain tranfer occurs is noted.

The overlay pattern can be seen to contain repetitive segments. When the field is aligned with the long dimension of an overlay segment, it induces poles in the end portions of that segment. We will assume that the field is initially in an orientation as indicated by the arrow H in FIG. 2 and that positive poles attract domains. One cycle of the field may be thought of as comprising four phases and can be seen to move a domain consecutively to the positions designated by the encircled numerals 1, 2, 3, and 4 in FIG. 2, these positions being occupied by positive poles consecutively as the rotating field comes into alignment therewith. Of course, domain patterns in the channels correspond to the repeat pattern of the overlay. That is to say, next adjacent bits are spaced one repeat pattern apart. Entire domain patterns representing consecutive binary words, accordingly, move consecutively to positions 13.

The particular starting position of FIG. 2 was chosen to avoid a description of normal domain propagation in response to rotating in-plane fields (considered unnecessary to this description). The consecutive positions from the right as viewed in FIG. 2 for a domain adjacent the vertical channel preparatory to a transfer operation are described. A domain in position 4 of FIG. 2 is ready to begin its transfer cycle.

2. Magnetic Garnet Composition

Garnets suitable for the practice of the invention are discussed in terms of general stoichiometry of the atom formula $I_3II_5O_{12}$. This is based on the classical yttrium iron garnet, "YIG" ($Y_3Fe_5O_{12}$). In this prototypical compound yttrium occupies the I or dodecahedral sites and magnetic moment contribution is by the preponderance of one tetrahedrally coordinated iron ion.

a. Dodecahedral Site

The composition requirement common to all supported garnet materials of the invention is the partial occupancy of the dodecahedral sites by lanthanum. This ion, primarily responsible for the in-plane anisotropy, is necessarily present in the amount of at least 0.1 atom per formula unit as indicated. In principle, there is a maximum tolerable lanthanum concentration. In practice, the maximum is dictated by the solubility limit which is generally less than 2 (always in terms of atoms per formula unit). The maximum dictated in practice is not so much as to preclude required occupancy by other ions, for example, to assure required emergent unique easy direction.

The presence of lanthanum is alone primarily responsible for in-plane anisotropy. Where emergent unique easy direction is to be stress induced or primarily stress induced, the primary requirements for further dodecahedral site occupancy have to do with valence balancing and structural integrity. Where there is to be a substantial growth induced contribution to emergent easy magnetic direction, other requirements are set. Such other requirements are considered in detail elsewhere, see for example, 26 Phys. Rev. Lett. 779 (1971 and 5 A.I.P. Conf. Proc. 57 (1971). Briefly, substantial growth induced contribution requires two additional ions in this site. They are identified largely in terms of usual practice. The inventive requirements, however, are somewhat broader and may be stated simply in terms of required occupancy to bring about the growth induced effect.

In accordance with general practice, the dodecahedral site includes at least 1 of the two ions of europium and samarium. The combined inclusion of such ions is at least 0.1 atoms in terms of the formula unit above although depending upon the nature of the accompanying ion below. Emergent easy direction, contributed solely by dodecahedral occupancy, may suggest a somewhat larger minimum content. As between the two, europium is preferred since it results in somewhat greater domain wall mobility than does samarium.

Still considering growth induced easy direction by virtue of dodecahedral site occupancy, current practice requires a third ion, to wit, calcium, strontium, yttrium, or one of the smaller 4f rare earths selected from element numbers 68 to 71 of the periodic chart according to Mendeleev.

b. Iron Sites

The prototypical compound contains iron ions in both the octahedral and tetrahedral sites. It is conventional practice to partially substitute with other elements in order to reduce the magnetic moment $4\pi M_s$. To this end, it is usual practice to select an element which preferentially occupies a tetrahedrally coordinated site. Examples are silicon, germanium, aluminum, gallium, and vanadium. Scandium and indium, occupying octahedral sites may be used for other reasons i.e., to tailor lattice parameter or magnetic properties. Of these, several are of a valence greater than that of the trivalent octahedral iron ion. Tetravalent silicon and germanium as well as pentavalent vanadium require valence balancing which is accomplished by inclusion of, for example, divalent calcium in the dodecahedral site. The usual practice of equal atom calcium content for tetravalent ions, and twice as much for vanadium, results in the required balancing.

In summation, the inventive requirement of in-plane anisotropy is accomplished simply by inclusion of at least 0.1 atom of lanthanum in a layer of garnet structure otherwise possessed of desired device characteristics. A preferred composition in which emergent unique easy direction is growth induced, requires at least 2 additional specific ions in the dodecahedral site, and usual practice dictates dilution of iron, generally tetrahedral iron, by a diluent (one or more nonmagnetic ions). A general formula for a preferred composition may be set forth as follows

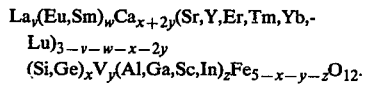

It will be observed that the above general formula assumes precise stoichiometry. While substantial second phase material is certainly to be avoided, a small deviation from stoichiometry is likely under real circumstances and so the general formula should be considered as an approximate representation. Ranges for the atom ratios are discussed:

v. It has been indicated that lanthanum is essential to every composition of the invention. The in-plane anisotropy realized in the [110] layer is attributed largely to the presence of this element. Sufficient anisotropy to result in a significant improvement in limiting velocity requires a minimal lanthanum content of 0.1. This then is the minimum value to be ascribed to v. In general, it is desirable to maximize in-plane anisotropy commensurate with other desiderata. For all materials studied, the maximum value for v corresponds with the solubility limit—that is, the maximum lanthanum content that can be tolerated without interference with the garnet structure. For many compositions this maximum lies at approximately v = 2. While in principle there could be other bases for limiting v, e.g., to permit adequate dodecahedral occupancy for growth induced anisotropy, the solubility limit is generally the limiting factor. A preferred minimum of 0.2 is dictated by the observation that such amount is invariably tolerated without interference with the crystalline structure and by the fact that the resulting in-plane anisotropy of at least approximately $k_u = 10^3$ ergs/cm$^3$ is thereby obtained. This value corresponds with a limiting velocity well in excess of that previously obtained by reported conventional, asgrown garnet compositions. Therefore, broad range v = 0.1 — solubility limit. Preferred range v = 0.2 — solubility limit.

w. Since a stress induced material requires only that dodecahedral site unoccupied by lanthanum be occupied by any permitted ion/s there is no general requirement that there be any europium or samarium. w may therefore equal zero. For growth induced easy direction however, it is a requirement that there be a substantial quantity of at least one of these two ions together with at least one of the other ions specified in the general formula as occupying a dodecahedral site. A minimum amount of europium or samarium corresponding with w = 0.1 is sufficient when properly associated to produce the desired effect. A preferred minimum of 0.2 is suggested by exhaustive studies carried out on growth induced materials over the past several years. This preferred minimum results in a sufficiently pronounced easy direction to ease device operating requirements. As between the two ions, a preference exists for europium since its use results in somewhat higher domain wall mobility. General range $w_{min} = 0$; preferred range $w_{min} = 0.1$; more preferred range $w_{min} = 0.2$.

x,y,z. It will be recognized that a primary purpose served by many of the included elements is that of a diluent. It is well known that the diluent serves to reduce magnetization from that of the unsubstituted prototypical compound (in which the theoretical 0 degree K contribution is the 1 Bohr-magneton resulting from the single uncompensated tetrahedrally coordinated iron ion). Depending upon desired operating parameters—primarily bubble size—$4\pi M_s$ values of from 100 gauss to 1000 gauss are generally indicated by present practice (although contemplated devices may use unsubstituted iron sites or even octahedral substitution (e.g., by Sc, In or Lu) to further increase moment. Assuming room temperature operation and assuming preferential tetrahedral site occupancy (a substantially valid assumption particularly for x, y and z constituents), a minimum preferred x+y+z = 0.4 is indicated. The maximum x+y+z content for most practical purposes is that resulting in near compensation which, under the assumption set forth, is numerically equal to 1 (as the maximum is approached, an increasing octahedral occupancy results so suggesting a maximum greater than one). x+2y content (calcium content) is necessarily that required for valence balancing although compositional tailoring may well take the form of a first prescription of calcium content followed by requisite silicon, germanium, or vanadium, for valence balancing. A preferred range is suggested by the desire to maintain bubbles of a diameter of 2 micrometers or less. Under many circumstances this in turn corresponds with $4\pi M_s \geq 400$ gauss, which in turn results in $x+y+z_{min} \leq 0.7$. Broad range $x+y+z = 0$ to 1.2; preferred range $x+y+z = 0.4$ to 1.1; more preferred range $x+y+z = 0.05-0.7$.

Other Compositional Arrangements.

Pairing for growth induced easy direction requires some minimum content of any of another element, e.g., any of the elements Ca, Sr, Y, Er, Tm, Yb, Lu. The minimum amount of such element resulting in a sufficiently pronounced emergent easy direction corresponds with an atom content of 0.1. A preferred minimum resulting in a sufficiently pronounced emergent easy direction to tolerate expected adverse operating conditions is 0.2. Therefore, broad range $x+2y+(3-v-w-x-2y) =$ at least 0.1. Preferred range $x+2y+(3-v-w-x-2y) =$ at least 0.2.

3. The Substrate

The substrate must be of the garnet structure to permit epitaxial growth and must be of substantially [110] orientation. The latter is expressed as [110] ±5 degrees. Epitaxial growth of requisite perfection requires a lattice parameter match of at least approximately ±0.5 percent. This is approximately equal to ±0.06 Angstrom unit. A preference exists for a closer match corresponding to a minimum deviation of about ±0.02 Angstrom unit (equivalent to approximately ±1/6 percent). An example made a part of this specification depends upon use of $Nd_3Ga_5O_{12}$. This material is a sufficiently close match for the particular magnetic garnet layer of that example. Other nonmagnetic or substantially nonmagnetic garnet substrate compositions are permitted in accordance with usual practice.

4. Device Design

The invention is premised upon the attainment of a limiting velocity value greater than that previously attainable for usual designs in conventional garnet materials. (Here the term "conventional" has reference to compositions of usual magnetization-temperature dependence, in turn permitting use of conventional biasing magnets.) For these purposes, limiting velocity previously attainable was a maximum of approximately 4000 cm/sec for either stress induced or growth induced anisotropy in garnet material. While other circumstances may well dictate use of the inventive materials, preferred embodiments take the form of device designs such as to realize improved values of limiting velocity. Accordingly, preferred device designs are defined as those provided with means for realizing velocity values of at least 4000 cm/sec.

5. Example

While considerations enumerated above depend upon extensive experimentation, it is useful to set forth a specific example. A device of the general configuration of FIG. 1 involves a layer of approximate thickness 3 μm of the composition $Eu_{2.1}La_{0.7}Ca_{0.2}Ge_{0.2}Al_{0.3}Ga_{0.2}Fe_{4.3}O_{12}$ atop a substrate of $Nd_3Ga_5O_{12}$ with [110] orientation.

Relevant parameters are $4\pi M_s \approx 400$ gauss
bubble diameter = 1.5 to 5 μm
wall energy = 0.23 to 0.36 ergs/cm$^2$
material length = 0.15 to 0.25 μm
uniaxial anisotropy field = $\approx 2000\ O_e$.

in-plane anisotropy field = $\approx 3000\ O_e$.

Measured results are reliably extrapolated to predict $10^{14}$ bubble steps without signal deterioration at a frequency of 1 mHz.

What is claimed is:

1. Memory device comprising a substrate of substrate garnet composition supporting at least a first epitaxial layer of first bubble garnet composition, the said layer being capable of evidencing uniaxial magnetic anisotropy capable of supporting local enclosed regions of magnetic polarization opposite to that of surrounding material, provided with first means for magnetically biasing said layer to stabilize said regions, second means for positioning such oppositely polarized local and enclosed regions, and third means for propagating such local regions, said material being of the garnet structure, characterized in that the said first bubble garnet composition contains at least 0.1 atom of lanthanum out of a total of 3 atoms in the crystallographic dodecahedral site and in that the said substrate has the crystallographic orientation [110] ± 5 degrees.

2. The device of claim 1 in which the minimum amount of lanthanum is 0.2.

3. The device of claim 1 in which the said substrate garnet composition contains neodymium in the dodecahedral site.

4. The device of claim 3 in which the said substrate garnet composition is of the approximate atom formula $Nd_3Ga_5O_{12}$.

5. The device of claim 1 including means for propagating bubbles at a velocity of at least 4000 cm/sec.

6. The device of claim 1 in which the first bubble garnet composition contains at least 0.1 atom of europium or samarium, or a mixture of these, in the dodecahedral site.

7. The device of claim 1 in which the dodecahedral site of the said first bubble garnet composition is occupied by such additional elements as result in a unique easy magnetic direction with such contribution contributing at least 50 percent of the required magnetic anisotropy for supporting local enclosed regions.

8. The device of claim 7 in which such additional elements include at least two elements.

9. The device of claim 8 in which said pair includes at least 0.1 of at least one of the elements of 10. The device of claim 9 in which the said bubble garnet composition may be represented by the approximate formula $La_v(Eu,Sm)_w Ca_{x+2y}(Sr,Y,Er,Tm,Yb,Lu)_{3-v-w-x-2y}(Si,Ge)_x V_y(Al,Ga,Sc,In)_z Fe_{5-x-y-z}O_{12}$ in which v = at least 0.1, w = at least 0.1, $x+y+z =$ from 0 to 1.2, and $x+2y+(3-v-w-x-2y) =$ at least 0.1

11. The device of claim 10 in which v = at least 0.2.

12. The device of claim 11 in which w = at least 0.2 and $x+2y+(3-v-w-x-2y) =$ at least 0.2.

13. The device of claim 10 in which $x+y+z =$ from 0.4 to 1.1

14. The device of claim 13 in which $x+y+z =$ from 0.05 to 0.7.

15. The device of claim 14 in which z = 0.

* * * * *

UNITED STATES PATENT AND TRADEMARK OFFICE
CERTIFICATE OF CORRECTION

PATENT NO. : 4,139,905
DATED : February 13, 1979
INVENTOR(S) : Stuart L. Blank, Roy C. LeCraw and Raymond Wolfe It is certified that error appears in the above-identified patent and that said Letters Patent are hereby corrected as shown below:

Column 7, line 4, "atoms" should be --atom--. Column 10, line 45, add the following --europium and samarium based on a total dodecahedral site occupancy of 3 atoms.--; line 49, "$(Si,Ge)_x V$" should be --$(Si,Ge)_x V$--.

Signed and Sealed this

*Eleventh* Day of *September 1979*

[SEAL]

*Attest:*

LUTRELLE F. PARKER
*Attesting Officer*   *Acting Commissioner of Patents and Trademarks*